United States Patent [19]

Choi

[11] Patent Number: 5,693,573
[45] Date of Patent: Dec. 2, 1997

[54] SEMICONDUCTOR PACKAGE LEAD DEFLASH METHOD

[75] Inventor: Sihn Choi, Choongcheongbuk-do, Rep. of Korea

[73] Assignee: LG Semicon Co., Ltd., Cheongju, Rep. of Korea

[21] Appl. No.: 785,020

[22] Filed: Jan. 17, 1997

[30] Foreign Application Priority Data

Jun. 14, 1996 [KR] Rep. of Korea ............ 21532/1996

[51] Int. Cl.$^6$ ............................................. H01L 21/60
[52] U.S. Cl. ..................... 437/220; 437/209; 437/217
[58] Field of Search ............................. 437/209, 210, 437/211, 212, 213, 214, 215, 216, 217, 218, 219, 220

[56] References Cited

U.S. PATENT DOCUMENTS

| | | | |
|---|---|---|---|
| 3,689,991 | 9/1972 | Aird | 437/207 |
| 4,874,722 | 10/1989 | Bednarz et al. | 437/209 |
| 5,106,784 | 4/1992 | Bednarz | 437/219 |
| 5,233,220 | 8/1993 | Lamson et al. | 257/676 |
| 5,326,932 | 7/1994 | You | 257/690 |
| 5,362,370 | 11/1994 | van der Heijden | 204/141.5 |
| 5,363,279 | 11/1994 | Cha | 257/692 |
| 5,428,248 | 6/1995 | Cha | 257/676 |
| 5,444,301 | 8/1995 | Song et al. | 257/737 |
| 5,471,088 | 11/1995 | Song | 437/211 |

*Primary Examiner*—Kevin Picardat
*Attorney, Agent, or Firm*—Fleshner & Kim

[57] ABSTRACT

A semiconductor package lead deflash method comprises the steps of forming a plating thin film on a plurality of leads, weakening an adhesive force of the plating thin film, and removing a flash and the plating thin film formed therebeneath respectively from the plurality of leads. The lead deflash method enables complete elimination of the lead flash formed during a package fabrication, and additionally serves as a pollution deterrent by adopting a chemical-free deflash method.

24 Claims, 2 Drawing Sheets

5,693,573

SEMICONDUCTOR PACKAGE LEAD DEFLASH METHOD

TECHNICAL FIELD

The present invention relates to a semiconductor package, and more particularly, to a method for removing flash adhering to the leads of the semiconductor package.

BACKGROUND ART

When a compound molding is completed in a package fabrication, a chip package lead deflash process is generally performed so as to eliminate a resin bleed and a flash formed on a lead surface during the molding process. Such package lead deflash method includes a chemical deflash or a mechanical deflash. The chemical deflash method is divided into a dry etching, a hydraulic etching, a wet etching or the like.

The dry etching can produce a noise problem due to a large dust collector and a significant amount of power consumption. The hydraulic etching can cause an unwanted impact on a package and also an undesired bending along the lead frame of a package in accordance with a high water pressure applied therein. In case of the wet etching process, the problems described above may be solved, yet, when the intervals between the leads are narrow, an abrasive has to be attached between the leads, causing a low package reliability.

The leads of a BLP are exposed at the bottom surface of a package. The externally exposed bottom lead surface is connected to an external terminal, such as a printed circuit board (PCB). A lead flash becomes attached on the entire lower surface of the bottom leads, thereby causing difficulty in eliminating the flash from the lead surface. Hence, the yield of a preferred quality package is seriously degraded.

FIG. 1 is a cross-sectional view showing a conventional BLP. A semiconductor chip is attached to a lead frame 2 by an adhesive 3. The bottom leads 2a are exposed. The inner leads are encapsulated by the molding resin 5. A gold wire, 4 electrically connects the bond pads of the semiconductor chip 1 to the lead 2.

As shown in FIG. 1, on the bottom surface of the bottom leads 2a becomes inevitably formed with a lead flash 6 during a molding process. Because the lead flash 6 is adhesively attached on the entire bottom lead surface, which will have to be exposed externally, the flash elimination from the bottom lead surface can hardly be obtained under such conventional deflash methods as described above.

To remove the flash occurring on such a BLP, a grinding deflash method has been solely adopted to the removal, whereby a lead flash is ground out therefrom. An extra grinding device has to be supplied to perform the grinding deflash method, since the grinding deflash method differs from the above-described chemical deflash method or mechanical deflash method.

DISCLOSURE OF THE INVENTION

An advantage of the present invention is in increasing the reliability of a package.

Another advantage of the present invention is in increasing the package yield.

A further advantage of the present invention is in decreasing the cost for making chip packages.

Another advantage of the present invention is in effectively removing lead flash.

The present invention is achieved at least in part by a semiconductor package lead deflash method comprises the steps of forming a plating thin film on a plurality of leads, weakening an adhesive force of the plating thin film, and removing a flash and the plating thin film formed therebeneath respectively from the plurality of leads.

The above advantages and others are achieved at least in part by a method of forming a semiconductor package, comprising the steps of: forming a disposable film on a predetermined portion of a first surface of a plurality of leads; mounting a chip on a second surface of the plurality of leads; connecting the plurality of leads to a plurality of bond pads of the chip; packaging the chip and the plurality of leads with a molded body such that the disposable film is exposed on an external surface of the bolded body; and removing the disposable film and flash, which is formed on the disposable film, such that the predetermined portion of the first surface of the plurality of leads is exposed on an external surface.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

Figure 1:
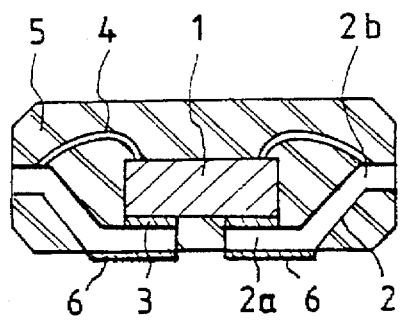
FIG. 1 is a cross-sectional view of a conventional BLP.
Figure 2:
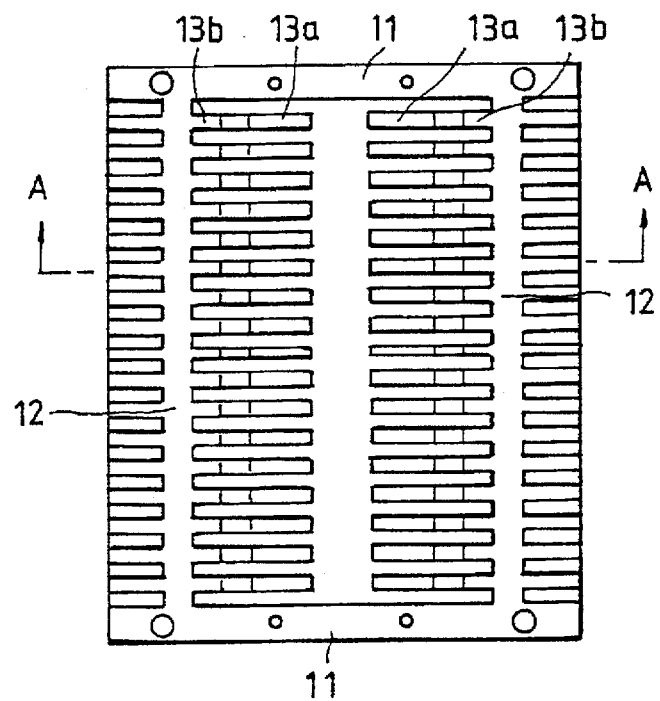
FIG. 2 is a plan view of a general BLP lead frame.
Figure 3:
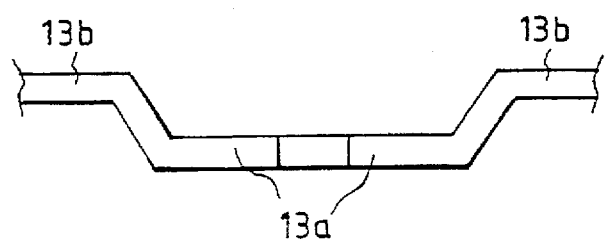
FIG. 3 is a cross-sectional view taken along the line A—A in FIG. 2.

FIG. 2 is a plan view of a general BLP lead frame. The lead includes a side rail 11, a chamber 12, a plurality of bottom leads 13a for connection to a PCB and a plurality of inner leads 13b for wire connection. FIG. 3 is a cross-sectional view taken along the line A—A in FIG. 2, wherein the bottom leads 13a and the inner leads 13b are specifically illustrated.

Figure 4A:
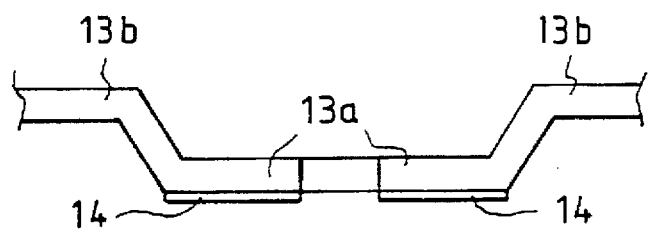
FIGS. 4A through 4D are cross-sectional process views of the BLP fabrication steps in accordance with an embodiment of the present invention.

FIGS. 4A through 4D illustrate the package fabrication steps of a BLP. As shown in FIG. 4A, a plating thin film or disposable film 14 is formed on the lower surface of the bottom leads 13 of the lead frame, on which lower surface a lead flash will be grown after a molding process. The plating thin film 14 is formed of a Sn—Ag (tin-silver) compound. The weight ratio of Sn to Ag is preferred to be eighty to twenty through eighty-five to fifteen (80:20–85:15). A Sn—Sb compound can be also used as the plating thin film. However, Sb is more expensive than Ag, and the Sn—Ag compound is more preferable. The melting point of such a Sn—Ag compound ranges from 330° C. to 380° C. A sputtering technique is preferably employed to form the plating thin film 14.

Figure 4B:
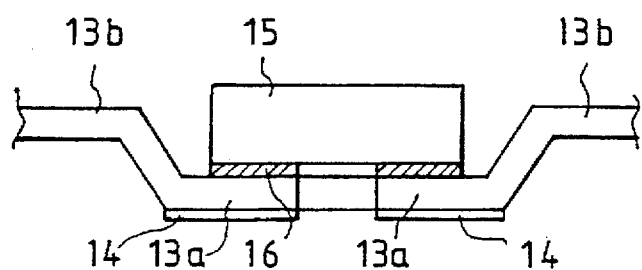

As shown in FIG. 4B, a semiconductor chip 15 is mounted on the upper surface of the bottom leads 13a using a double sided insulation tape 16 selected from one of polyamide adhesion tapes, having a glass transition temperatures ($T_g$) of about 150° C. The peak temperature during the die attach process is desired to be about 300° C. thereby preventing the melt down of the plating thin film 14 during the chip attach process, but the adhesive force thereof is weakened. Further, a flaking property of the plating thin film 14 can be obtained.

When a die attach process is performed using conventional double sided adhesion tapes, a peak temperature in the die attach process stays at a temperature of 400° C. for three to four seconds. Accordingly, the Ag weight ratio against Sn in the Sn—Ag compound has to be increased up to 40 percents so as to raise the melting point thereof to a desired point. However, because an Ag material costs more than that of Sn, the double sided adhesion tape having a low glass transition temperature ($T_g$) is recommended to apply to the die attach process.

Figure 4C:
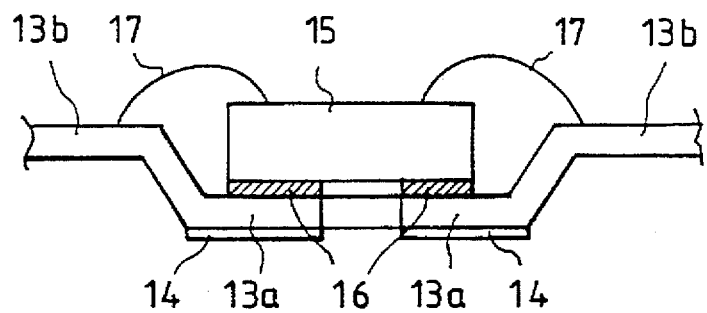
Figure 4D:
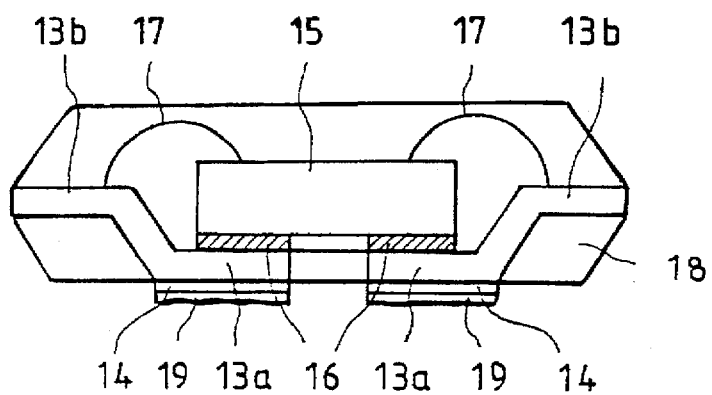

After the die attach process, as shown in FIG. 4C, a wire bonding is performed to connect the chip 15 to each of the inner leads 13b using conductive wires 17. As shown in FIG. 4D, a resin molding is performed to package the chip using a molding resin 18, but the lower surface of each of the bottom leads 13a is exposed. A cure process is subsequently performed to cure the molding resin 18. During the above molding process, the flash 19 is adhesively formed on the surface of the plating thin film 14.

During a post-molding cure process, which lasts for about five hours at a temperature of 180° C. and without any particular mold cavity design, the plating thin film 14 on which the flash is grown gradually begins losing its adhesive force thereof. A wet etching lead deflash process is performed by strongly jetting a hydro-media compound onto the package bottom member or the lower portion of the bottom leads 13a. As a result, the plating thin film 14 formed beneath the flash 19 and attached to the bottom surface of the bottom leads 13a is easily and cleanly removed from the bottom surface of the bottom leads 13a, thereby obtaining the complete deflash.

As described in the above, the semiconductor package lead deflash method in accordance with the present invention enables completely eliminating the lead flash growing during a BLP fabrication and additionally serves as a pollution deterrent by adopting chemical-free deflash method. The foregoing embodiment is merely exemplary and not to be construed as limiting the present invention. The present scheme can be readily applied to other types of packages where the leads are exposed, requiring removal of the flash. For example, the present invention may be applied to the packages disclosed in U.S. Pat. Nos. 5,363,279, 5,428,248, 5,326,932, 5,444,301 and 5,471,088, commonly assigned to the same assignee as this application, and whose disclosures are incorporated herein by reference. Further, the present invention discloses the chip being completely encapsulated by the molding resin. As can be appreciate, the present invention is applicable to packages which do not completely encapsulate the semiconductor chip, i.e., the molding resin packages the semiconductor chip. The description of the present invention is intended to be illustrative, and not limiting the scope of the claims. Many alternatives, modifications and variations will be apparent to those skilled in the art.

I claim:

1. A semiconductor package lead deflash method, comprising the steps of:

forming a plating thin film on a plurality of leads;

weakening an adhesive force of said plating thin film from said plurality of leads; and removing a lead flash and said plating thin film formed therebeneath respectively from the plurality of leads.

2. The method of claim 1, wherein said plating thin film is formed of a Sn—Ag compound.

3. The method of claim 1, wherein said plating thin film is formed of a Sn—Sb.

4. The method of claim 1, wherein said step of forming said plating thin film comprises the steps of sputtering said plating thin film.

5. The method of claim 1, wherein the removal step comprises a wet etching technique.

6. The method of claim 5, wherein said wet etching is performed by strongly jetting a hydro-media compound onto a flash-grown portion of the plurality of leads, thereby removing said flash and said plating thin film respectively.

7. The method of claim 2, wherein a melting point of said Sn—Ag compound is adjusted to be higher than a peak temperature at an accompanying process of the formation of said plating thin film, thereby merely weakening an adhesive force and preventing the melting down of said plating thin film.

8. The method of claim 7 further comprising the steps of die attaching and curing.

9. The method of claim 3, wherein the melting point of said Sn—Sb compound is adjusted to be higher than a peak temperature at an accompanying process of the formation of said plating thin film, thereby merely weakening an adhesive force and preventing the melting down of said plating thin film.

10. The method of claim 9 further comprising the steps of die attaching and curing.

11. The method of claim 1, wherein a polyamide adhesive is used during said die attaching.

12. The method of claim 10, wherein the step for weakening the adhesive force of said plating thin film is gradually performed in accordance with the temperatures provided during said die attaching and curing.

13. A method of forming a semiconductor package, comprising the steps of:

forming a disposable film on a predetermined portion of a first surface of a plurality of leads;

mounting a chip on a second surface of said plurality of leads;

connecting said plurality of leads to a plurality of bond pads of said chip;

packaging said chip and said plurality of leads with a molded body such that said disposable film is exposed on an external surface of said bolded body; and removing said disposable film and flash, which is formed on said disposable film, such that said predetermined portion of said first surface of said plurality of leads is exposed on an external surface.

14. The method of claim 13, wherein said disposable film comprises at least one of a Sn—Ag compound and a Sn—Sb compound.

15. The method of claim 14, wherein a weight ratio of said Sn—Ag compound is about 80:20 to 85:15, respectively.

16. The method of claim 13, wherein said disposable film is sputtered onto said predetermined portion.

17. The method of claim 13, wherein said chip is mounted on said plurality of leads using an adhesive.

18. The method of claim 13, wherein said connecting step comprises a wire bonding process.

19. The method of claim 13, wherein said packaging step comprises:

molding said chip and leads with resin; and curing the molding resin.

20. The method of claim 19, wherein said molding resin encapsulates the semiconductor chip.

21. The method of claim 13, wherein said disposable film becomes flaky during the mounting process.

22. The method of claim 13, wherein said disposable film loses adhesive property during the packaging step.

23. The method of claim 13, wherein said removing step comprises wet etching lead deflash process.

24. The method of claim 23, wherein said wet etching lead deflash process comprises spraying a hydromedia compound onto said predetermined portion.

* * * * *